(12) United States Patent
Shin et al.

(10) Patent No.: US 7,936,213 B2
(45) Date of Patent: May 3, 2011

(54) DOHERTY AMPLIFIER AND SIGNAL AMPLIFICATION SYSTEM HAVING THE SAME, METHOD FOR AMPLIFYING SIGNAL

(75) Inventors: Jin Ho Shin, Seongnam-si (KR); Ki Chon Han, Incheon (KR)

(73) Assignee: Xronet Corporation (KR)

( * ) Notice: Subject to any disclaimer, the term of this patent is extended or adjusted under 35 U.S.C. 154(b) by 0 days.

(21) Appl. No.: 12/545,961

(22) Filed: Aug. 24, 2009

(65) Prior Publication Data
US 2010/0052779 A1   Mar. 4, 2010

(30) Foreign Application Priority Data

Aug. 28, 2008  (KR) .................. 10-2008-0084528

(51) Int. Cl.
 *H03F 3/68* (2006.01)
(52) U.S. Cl. ..................... 330/124 R; 330/295
(58) Field of Classification Search .......... 330/124 R, 330/295, 84, 289, 296, 54
See application file for complete search history.

(56) References Cited

U.S. PATENT DOCUMENTS

| 6,917,246 B2* | 7/2005 | Thompson ............ 330/295 |
| 7,427,895 B1* | 9/2008 | Okubo et al. ......... 330/124 R |
| 7,646,248 B2* | 1/2010 | Yang et al. ............ 330/295 |
| 7,756,494 B2* | 7/2010 | Fujioka et al. ......... 455/127.1 |
| 2010/0079210 A1* | 4/2010 | Yamauchi et al. ....... 330/295 |

FOREIGN PATENT DOCUMENTS

| KR | 10-2004-0019779 A | 3/2004 |
| KR | 10-2004-0043306 A | 5/2004 |
| KR | 10-0749870 B1 | 8/2007 |
| KR | 10-2007-0122140 A | 12/2007 |

* cited by examiner

*Primary Examiner* — Hieu P Nguyen

(74) *Attorney, Agent, or Firm* — Cantor Colburn LLP

(57) ABSTRACT

A Doherty amplifier is provided. The Doherty amplifier includes a first path circuit including a carrier amplifier and a first impedance adjusting circuit connected with the carrier amplifier; and a second path circuit including a peaking amplifier, a second impedance adjusting circuit connected with the peaking amplifier, and a peaking amplifier bias circuit connected with the peaking amplifier. At least one among an impedance of the first impedance adjusting circuit, an impedance of the second impedance adjusting circuit, and a bias of the peaking amplifier bias circuit is adjusted in response to a control signal.

14 Claims, 13 Drawing Sheets

DOHERTY AMPLIFIER AND SIGNAL AMPLIFICATION SYSTEM HAVING THE SAME, METHOD FOR AMPLIFYING SIGNAL

PRIORITY STATEMENT

This application claims the benefit of priority under 35 U.S.C. §119 to Korean Patent Application No. 10-2008-0084528, filed on Aug. 28, 2008, in the Korean Intellectual Property Office, the entire contents of which is incorporated herein by reference

BACKGROUND

Example of the present invention relates to a Doherty amplifier, a signal amplification system including the same, and a method for amplifying a signal.

With the compactness and multifunction of mobile communication terminals, many approaches for increasing the operating time of a battery for the terminals have been researched and developed. Of those, there has been a lot of research into an approach for increasing the efficiency of a radio frequency (RF) power amplifier accounting for most of the power consumption of a mobile communication terminal and a representative solution is a Doherty amplifier. However, existing communication protocol standards employ a wide bandwidth while the Doherty amplifier using a $\lambda/4$ line (hereinafter, $\lambda$ refers to a wavelength) uses a narrow bandwidth, and therefore, it is very difficult to achieve high amplification efficiency.

In addition, since the Doherty amplifier uses a carrier amplifier and a peaking amplifier connected in parallel, it is sensitive to a phase difference between the two amplifiers and to the magnitude of a signal of each amplifier. Also, the Doherty amplifier connects the two amplifiers using a quarter wave transformer, thus fundamentally having a narrow frequency band. Moreover, the quarter wave transformer is implemented using a micro strip line, the size of which is very big for high frequency, and therefore, there is a limit to decreasing the size of the quarter wave transformer and the Doherty amplifier including the same.

SUMMARY

The present invention provides a Doherty amplifier with high efficiency in a wideband system and a signal amplification system including the same. The present invention also provides a Doherty amplifier with compactness fitting into a mobile terminal and a signal amplification system including the same. The present invention also provides a Doherty amplifier insensitive to temperature and frequency and a signal amplification system including the same. The present invention also provides a method of amplifying a signal of the Doherty amplifier.

According to an aspect of the present invention, there is provided a Doherty amplifier including a first path circuit which includes a carrier amplifier and a first impedance adjusting circuit connected with the carrier amplifier; and a second path circuit which includes a peaking amplifier, a second impedance adjusting circuit connected with the peaking amplifier, and a peaking amplifier bias circuit connected with the peaking amplifier. At least one among an impedance of the first impedance adjusting circuit, an impedance of the second impedance adjusting circuit, and a bias of the peaking amplifier bias circuit is adjusted in response to a control signal.

Each of the first impedance adjusting circuit and the second impedance adjusting circuit may include at least one capacitor and at least one inductor, and at least one among a capacitance of the at least one capacitor and an inductance of the at least one inductor may be adjusted in response to the control signal. The control signal may be determined based on an operating frequency of the Doherty amplifier.

The first path circuit may further include a carrier amplifier bias circuit configured to adjust a bias of the carrier amplifier, and the bias value of the peaking amplifier adjusted by the peaking amplifier bias circuit may be less than the bias value of the carrier amplifier adjusted by the carrier amplifier bias circuit. At least one among the carrier amplifier bias circuit and the peaking amplifier bias circuit may be implemented by a proportional to absolute temperature (PTAT) bias circuit. The PTAT bias circuit may include a plurality of resistors and adjust a PTAT slope by changing a resistance of at least one of the resistors.

The second impedance adjusting circuit may compensate for a phase difference corresponding to a difference between a bias of the carrier amplifier and a bias of the peaking amplifier. The first impedance adjusting circuit may include a first variable capacitor circuit including a capacitor varying in response to the control signal to adjust the impedance of the first impedance adjusting circuit, and the second impedance adjusting circuit may include a second variable capacitor circuit including a capacitor varying in response to the control signal to adjust the impedance of the second impedance adjusting circuit. The peaking amplifier bias circuit may include at least one among a temperature compensation circuit and a frequency compensation circuit, and a current of at least one among the temperature compensation circuit and the frequency compensation circuit may be adjusted in response to the control signal.

According to another aspect of the present invention, there is provided a Doherty amplifier including a splitter configured to split an input signal into a plurality of signals, a carrier amplifier configured to receive one signal among the plurality of signals output from the splitter and amplify the signal, a first phase adjusting circuit configured to shift a phase of a signal output from the carrier amplifier by 90°, a second phase adjusting circuit configured to shift by "90°+offset angle" a phase of another signal among the plurality of signals output from the splitter, and a peaking amplifier configured to receive a signal output from the second phase adjusting circuit and amplify the signal. The offset angle may be determined based on a difference between a bias of the carrier amplifier and a bias of the peaking amplifier.

Each of the first phase adjusting circuit and the second phase adjusting circuit may include at least one capacitor and at least one inductor and adjust at least one among a capacitance of the at least one capacitor and an inductance of the at least one inductor in response to the control signal. The control signal may be determined based on an operating frequency of the Doherty amplifier.

According to a further aspect of the present invention, there is provided a signal amplification system including a control signal generator configured to modulate or demodulate a signal and output a control signal based on a frequency of the signal and a Doherty amplifier. At least one among impedance of the Doherty amplifier, a phase of the Doherty amplifier, and a bias of the Doherty amplifier is adjusted in response to the control signal output from the control signal generator.

The Doherty amplifier may include a first impedance adjusting circuit connected with a carrier amplifier, a second impedance adjusting circuit connected with a peaking amplifier, and a peaking amplifier bias circuit connected with the peaking amplifier. At least one among an impedance of the first impedance adjusting circuit, an impedance of the second impedance adjusting circuit, and a bias of the peaking amplifier bias circuit may be adjusted in response to a control signal.

Alternatively, the Doherty amplifier may include a splitter configured to split an input signal into a plurality of signals; a first phase adjusting circuit configured to shift by 90° a phase of a signal output from a carrier amplifier, which receives one signal among the plurality of signals output from the splitter and amplifies the signal; a second phase adjusting circuit configured to shift by "90°+offset angle" a phase of another signal among the plurality of signals output from the splitter; and a peaking amplifier configured to receive a signal output from the second phase adjusting circuit and amplify the signal. The offset angle may be determined based on a difference between a bias provided to the carrier amplifier and a bias provided to the peaking amplifier.

According to another aspect of the present invention, there is provided a signal amplification method of a Doherty amplifier. In the method, a first phase adjusting circuit adjusts a phase of an amplified signal output from a carrier amplifier in response to a control signal generated as a result of detecting an operating frequency A second phase adjusting circuit adjusts a phase of an input signal input to an input terminal of a peaking amplifier to be the same as the phase of the amplified signal in response to the control signal. A peaking amplifier bias circuit adjusts a magnitude of the input signal input to the input terminal of the peaking amplifier to be the same as a magnitude of the amplified signal in response to the control signal.

The first phase adjusting circuit may adjust at least one among a capacitance of the first phase adjusting circuit and an inductance of the first phase adjusting circuit in response to the control signal, thereby adjusting the phase of the amplified signal and outputting a phase-adjusted amplified signal. The second phase adjusting circuit may adjust at least one among a capacitance of the second phase adjusting circuit and an inductance of the second phase adjusting circuit in response to the control signal, thereby adjusting the phase of the input signal to be the same as a phase of the phase-adjusted amplified signal. The peaking amplifier bias circuit may adjust a bias of the peaking amplifier bias circuit connected with the peaking amplifier in response to the control signal, thereby adjusting the magnitude of the input signal to be the same as a magnitude of a magnitude-adjusted amplified signal.

According to still another aspect of the present invention, there is provided a signal amplification method of a Doherty amplifier. In the method, a control signal generator detects an operating frequency of the Doherty amplifier and outputs a control signal. The Doherty amplifier adjusts at least one among an impedance of a first impedance adjusting circuit connected with a carrier amplifier of the Doherty amplifier, an impedance of a second impedance adjusting circuit connected with a peaking amplifier of the Doherty amplifier, and a bias of a peaking amplifier bias circuit connected with the peaking amplifier in response to the control signal.

The impedance of the first impedance adjusting circuit may be adjusted by adjusting at least one among a capacitance of the first impedance adjusting circuit and an inductance of the first impedance adjusting circuit in response to the control signal. The impedance of the second impedance adjusting circuit may be adjusted by adjusting at least one among a capacitance of the second impedance adjusting circuit and an inductance of the second impedance adjusting circuit in response to the control signal. The bias of the peaking amplifier bias circuit may be adjusted by adjusting a current of a temperature compensation circuit or frequency compensation circuit of the peaking amplifier bias circuit.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1:
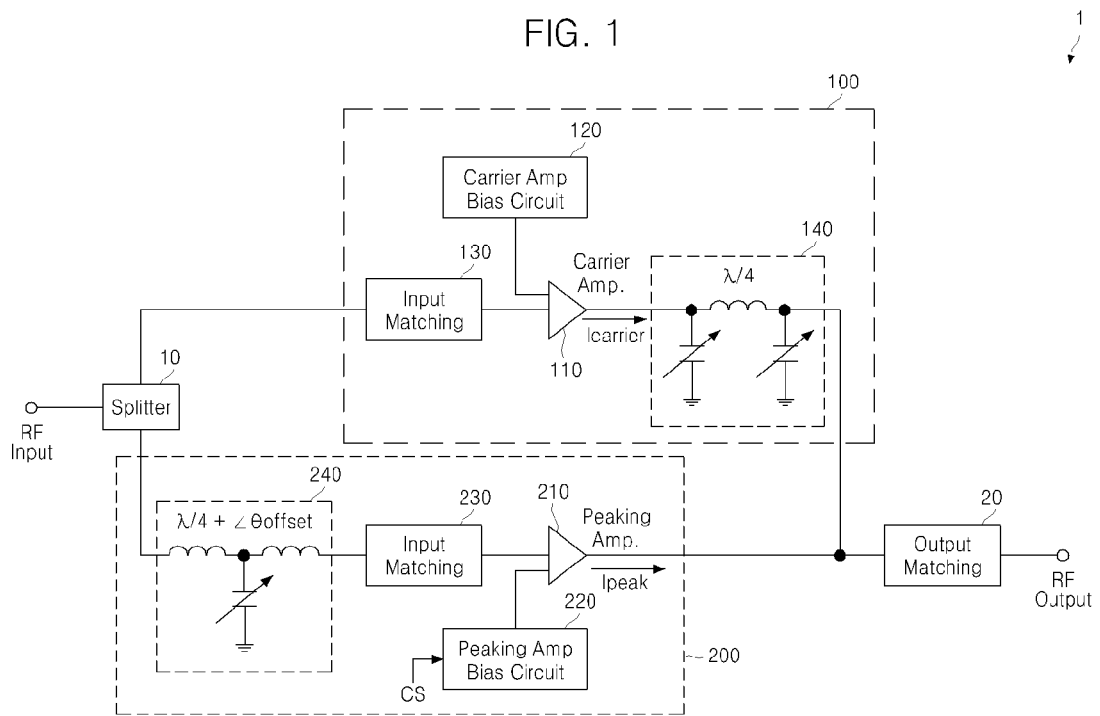
FIG. 1 is a schematic block diagram of a Doherty amplifier according to some embodiments of the present invention.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic block diagram of a Doherty amplifier 1 according to some embodiments of the present invention. The Doherty amplifier 1 may include a first path circuit 100 including a carrier amplifier 110 and a first impedance adjusting circuit 140 connected with the carrier amplifier 110 and a second path circuit 200 including a peaking amplifier 210 and a second impedance adjusting circuit 240 connected with the peaking amplifier 210.

The Doherty amplifier 1 in which the carrier amplifier 110 and the peaking amplifier 210 are connected in parallel using a quarter wave transformer (or a λ/4 line) adjusts the load line impedance of the carrier amplifier 110 by changing the amount of current supplied to a load according to a power level using the peaking amplifier 210, thereby increasing signal amplification efficiency. In detail, the carrier amplifier 110 may operate in Class AB or Class B mode, and the peaking amplifier 210 may operate in Class B or Class C mode in order to acquire an on/off characteristic with respect to input power. The peaking amplifier 210 turns off at low power and operates at high power. Accordingly, the signal amplification efficiency of the Doherty amplifier 1 can be increased by increasing a load viewed from the carrier amplifier 110 at low power.

As described above, since the quarter wave transformer implemented by a micro strip line is an obstacle to the compactness or integration of an amplifier, the quarter wave transformer may be implemented by a π-network or T-network including at least one capacitor and at least one inductor as illustrated in FIG. 1. In addition, to synchronize the delay of the carrier amplifier 110 with the delay of the peaking amplifier 210, the second impedance adjusting circuit 240 may be disposed at an input terminal of the peaking amplifier 210.

The first impedance adjusting circuit 140 and the second impedance adjusting circuit 240 may include at least one capacitor and at least one inductor and may control at least one among the capacitance of the capacitor and the inductance of the inductor in response to a control signal CS. The control signal CS may be determined based on the operating frequency of the Doherty amplifier 1. In addition, the control signal CS may be a digital signal having a predetermined number of bits and may be output by a control signal generator (e.g., a modem (not shown)) informed of the operating frequency of the Doherty amplifier 1.

Accordingly, even when the Doherty amplifier 1 operates at different frequencies in a broadband, the Doherty amplifier 1 can have high signal amplification efficiency in the broadband by adaptively adjusting at least one among the impedance of the first impedance adjusting circuit 140 and the impedance of the second impedance adjusting circuit 240.

In describing the Doherty amplifier 1 in more detail, an input signal RF Input is split and output through at least two paths by a splitter 10. The splitter 10 may be any device that can split the input signal RF Input into at least two paths and may be implemented by a Wilkinson power divider. In the embodiments illustrated in FIG. 1, the input signal RF Input is split into two paths, i.e., the first path circuit 100 including the carrier amplifier 110 and the second path circuit 200 including the peaking amplifier 210, but the present invention is not restricted to these embodiments. For instance, the input signal RF Input may be split into three or more paths.

The Doherty amplifier 1 may include path circuits in which a plurality of carrier amplifiers 110 are connected in parallel, path circuits in which a plurality of peaking amplifiers 210 are connected in parallel, or path circuits in which a plurality of carrier amplifiers 110 and a plurality of peaking amplifiers 210 are connected in parallel. Signals output from the splitter 10 may be impedance-matched at input matching circuits 130 and 230, respectively, and impedance-matched again at an output matching circuit 20.

The output matching circuit 20 is disposed after a node at which an output terminal of the first path circuit 100 and an output terminal of the second path circuit 200 meet in the embodiments illustrated in FIG. 1, but it may be disposed at each of the output terminals before the node in other embodiments of the present invention. At least one among the impedance of the first impedance adjusting circuit 140 and the impedance of the second impedance adjusting circuit 240 may be adjusted in response to the control signal CS related with the operating frequency.

As described above, since the Doherty amplifier 1 is sensitive to the change in frequency, amplification efficiency can be maximized in a broadband by adjusting at least one among the impedance of the first impedance adjusting circuit 140 and the impedance of the second impedance adjusting circuit 240 in response to the control signal CS corresponding to the frequency change. In detail, the first impedance adjusting circuit 140 may be implemented by a $\lambda/4$ $\pi$-network so that a phase difference between an input signal and an output signal of the first impedance adjusting circuit 140 is always 90 degrees regardless of the operating frequency.

Since a conventional Doherty amplifier has fixed capacitance or inductance and does not flexibly cope with the operating frequency, signal amplification efficiency cannot be increased. Therefore, in the embodiments of the present invention, when the first impedance adjusting circuit 140 always maintains the phase difference 90 degrees with respect to any operating frequency in response to the control signal CS related with the operating frequency, high signal amplification efficiency can be achieved in a broadband.

The Doherty amplifier 1 may also include a carrier amplifier bias circuit 120 adjusting the bias of the carrier amplifier 110 and a peaking amplifier bias circuit 220 adjusting the bias of the peaking amplifier 210. In a conventional Doherty amplifier, an offset line is disposed in the first path circuit 100 and the second path circuit 200 in order to minimize power leaking to a peaking amplifier. However, as described above, the offset line is an obstacle to the compactness and/or integration. Accordingly, the Doherty amplifier 1 according to the current embodiments of the present invention does not use the offset line but adjusts the bias of the peaking amplifier 210 instead.

In detail, the bias of the peaking amplifier 210 adjusted by the peaking amplifier bias circuit 220 is less than the bias of the carrier amplifier 110 adjusted by the carrier amplifier bias circuit 120. The bias may be a bias voltage or a bias current. The peaking amplifier 210 is completely turned off at low output by lowering the bias of the peaking amplifier 210, so that power loss caused by the peaking amplifier 210 that is not turned off completely can be minimized. Effects brought about by lowering the bias of the peaking amplifier 210 will be described with reference to FIG. 2.

Figure 2:
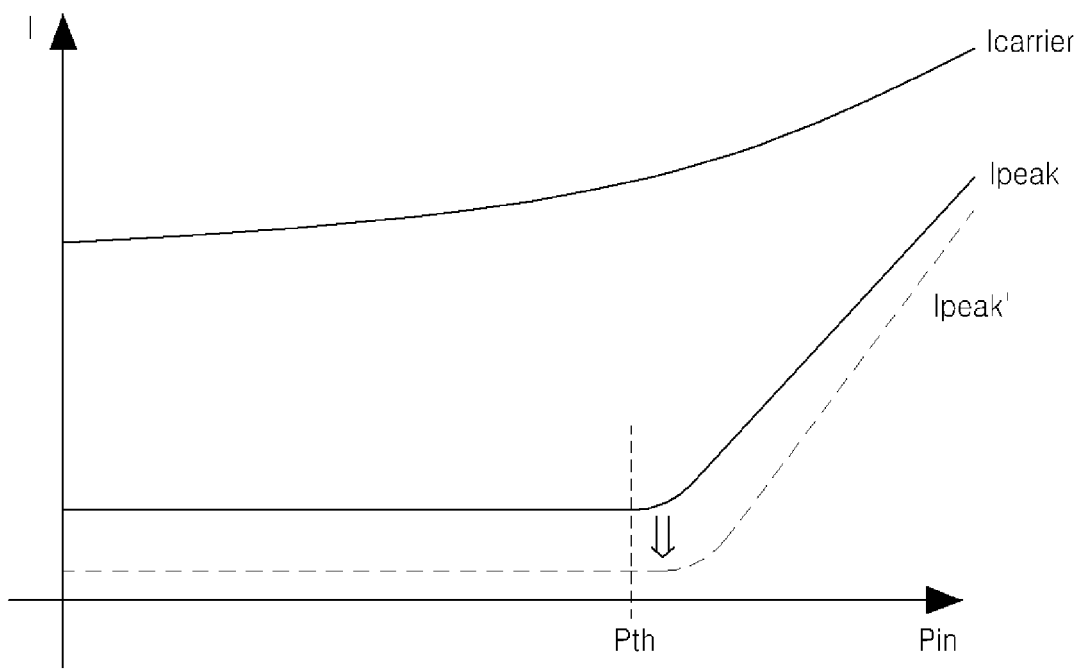
FIG. 2 is a graph of the current against the bias of a peaking amplifier according to some embodiments of the present invention.

FIG. 2 is a graph of the current against the bias of the peaking amplifier 210 according to some embodiments of the present invention. Referring to FIGS. 1 and 2, "Icarrier" and "Ipeak" denote a current flowing in the first path circuit 100 and a current flowing in the second path circuit 200, respectively, when the bias of the carrier amplifier 110 is the same as the bias of the peaking amplifier 210.

As illustrated in FIG. 2, the current flowing in the peaking amplifier 210 is ignorably small when power Pin of an input signal is low and the peaking amplifier 210 operates when the power Pin exceeds a predetermined threshold value Pth. The curve of "Ipeak" illustrated in FIG. 2 is obtained when the bias of the peaking amplifier 210 is lower than the bias of the carrier amplifier 110. An Ipeak' value is lower than the Ipeak value at low power, and therefore, a conventional offset line can be replaced by completely turning off the peaking amplifier 210.

When the bias of the peaking amplifier 210 is different from that of the carrier amplifier 110, the operating point of the peaking amplifier 210 becomes different from that of the carrier amplifier 110. As a result, there occurs a phase difference between the two amplifiers 110 and 210. According to the current embodiments of the present invention, the Doherty amplifier 1 compensates for the phase difference using the second impedance adjusting circuit 240 connected with a front end of the peaking amplifier 210. In detail, the second impedance adjusting circuit 240 adjusts at least one among its capacitance and its inductance so that a phase difference between an input signal and an output signal of the second impedance adjusting circuit 240 is "90°+offset angle ($\angle\theta$offset)".

The second impedance adjusting circuit 240 illustrated in FIG. 1 is expressed by "$\lambda/4+\angle\theta$offset" in the sense that the second impedance adjusting circuit 240 produces a phase difference of "90°+$\angle\theta$offset". Similarly to the first impedance adjusting circuit 140, the second impedance adjusting circuit 240 may adjust at least one among the capacitance and the inductance in response to the control signal CS related with the operating frequency. Accordingly, the problem of increasing the size of a chip due to the disposition of an offset line can be overcome by compensating for an offset using the second impedance adjusting circuit 240. Consequently, the compactness and/or integration of a device can be accomplished.

Figure 3A:
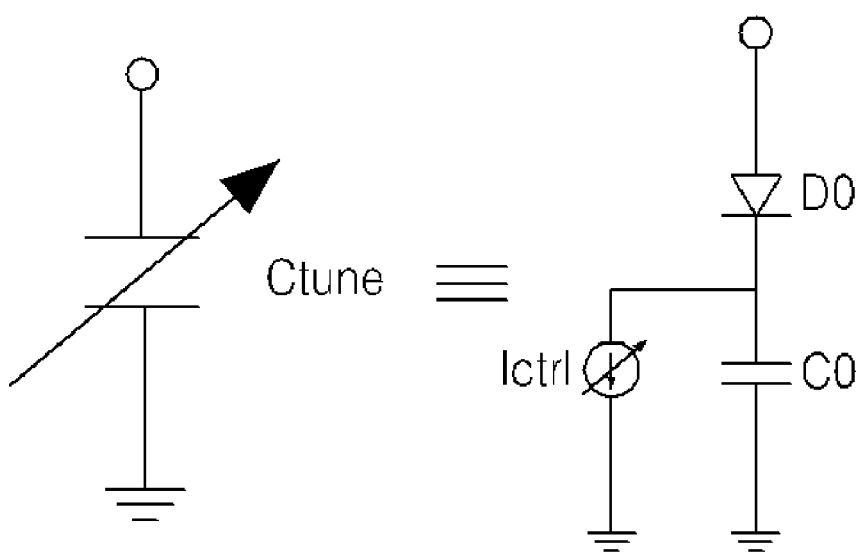
FIG. 3A is a circuit diagram of a variable capacitor circuit according to some embodiments of the present invention.

FIG. 3A is a circuit diagram of a variable capacitor circuit 141 or 241 according to some embodiments of the present invention. Referring to FIGS. 1 and 3A, each of the impedance adjusting circuits 140 and 240 included in the Doherty amplifier 1 may adjust at least one among the capacitance and the inductance in response to the control signal CS related with the operating frequency, and the circuit 141 or 241 shown in FIG. 3A illustrates a circuit that variably adjusts the capacitance. Each of the variable capacitor circuits 141 and 241 may include a capacitor C0, a current source Ictrl, and a diode D0.

Although the capacitance is adjusted by turning on or off the diode D0 according to the existence or non-existence of the current source Ictrl in the embodiments illustrated in FIG. 3A, any type of circuits that can adjust the capacitance can be used in other embodiments of the present invention. The diode D0 may be a base collector junction diode. The current source Ictrl is determined based on the control signal CS related with the operating frequency. A method of adjusting the capacitance according to the existence or non-existence of the current source Ictrl will be described with reference to FIG. 3B.

Figure 3B:
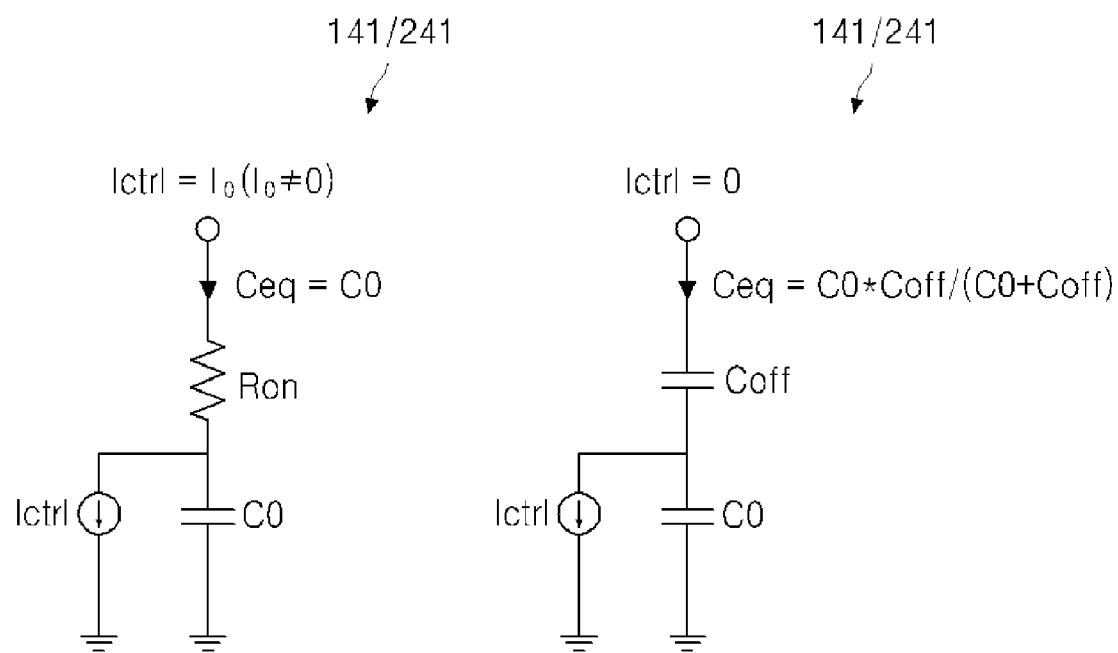
FIG. 3B is a circuit diagram for explaining a method of adjusting capacitance in a variable capacitor circuit according to some embodiments of the present invention.

FIG. 3B is a circuit diagram for explaining a method of adjusting the capacitance in the variable capacitor circuit 141 or 241 according to some embodiments of the present invention. The variable capacitor circuit 141 or 241 in which the current source Ictrl outputs non-zero current $I_0$ in response to the control signal CS is shown on the left of FIG. 3B and the variable capacitor circuit 141 or 241 in which the current source Ictrl outputs zero current in response to the control signal CS is shown on the right of FIG. 3B. When the non-zero current $I_0$ is output from the current source Ictrl in response to the control signal CS, the diode D0 is turned on so as to be equivalently replaced by an on-resistor Ron. As a result, equivalent capacitance Ceq becomes the same as the capacitance of the capacitor C0.

When the zero current is output from the current source Ictrl in response to the control signal CS, the diode D0 is turned off so as to be equivalently replaced by a capacitor Coff having predetermined capacitance. As a result, the equivalent capacitance Ceq becomes C0×Coff/(C0+Coff), i.e., capacitance obtained when the capacitors Coff and C0 are connected in series.

The variable capacitor circuit 141 or 241 may be implemented by connecting a plurality of circuits illustrated in FIG. 3A in series or parallel to obtain various capacitances. Similarly, the inductance may be adjusted in response to the control signal CS related with the operating frequency. In other embodiments of the present invention, both of the inductance and the capacitance may be adjusted in response to the control signal CS related with the operating frequency.

Figure 4A:
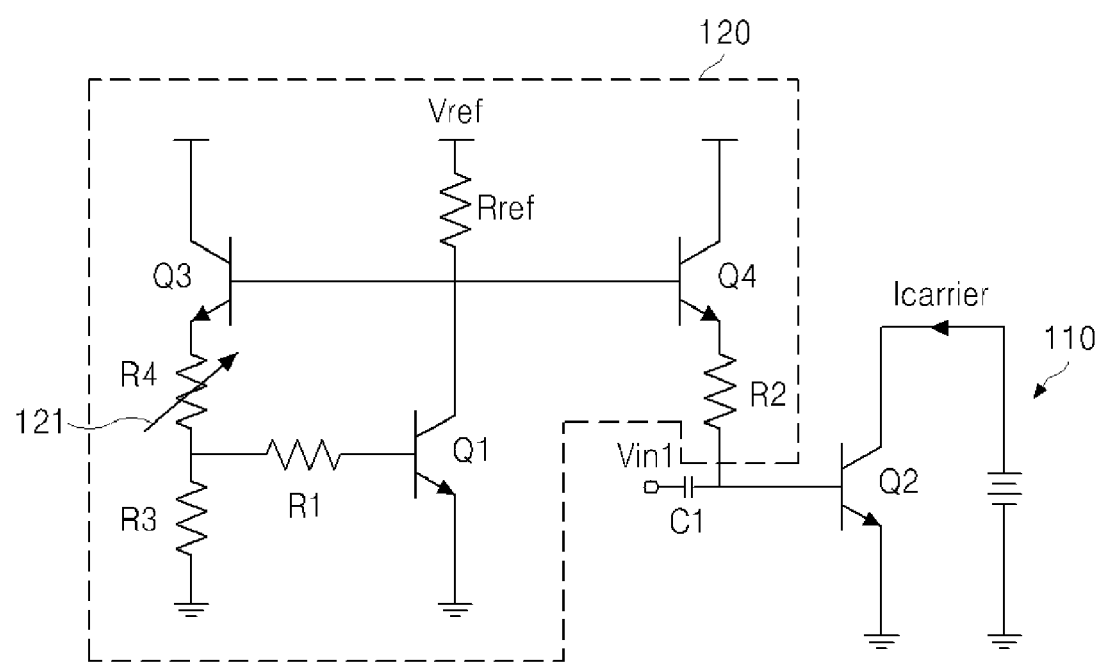
FIG. 4A is a circuit diagram of a carrier amplifier bias circuit according to some embodiments of the present invention.

FIG. 4A is a circuit diagram of the carrier amplifier bias circuit 120 for the carrier amplifier 110 according to some embodiments of the present invention. Referring to FIG. 4A, the carrier amplifier bias circuit 120 may be implemented by a proportional to absolute temperature (PTAT) bias circuit, in which the current Icarrier increases as temperature increases. When the PTAT bias circuit 120 is used, a problem of an amplifier sensitive to temperature and having a gain changing according to the temperature can be overcome.

Figure 4B:
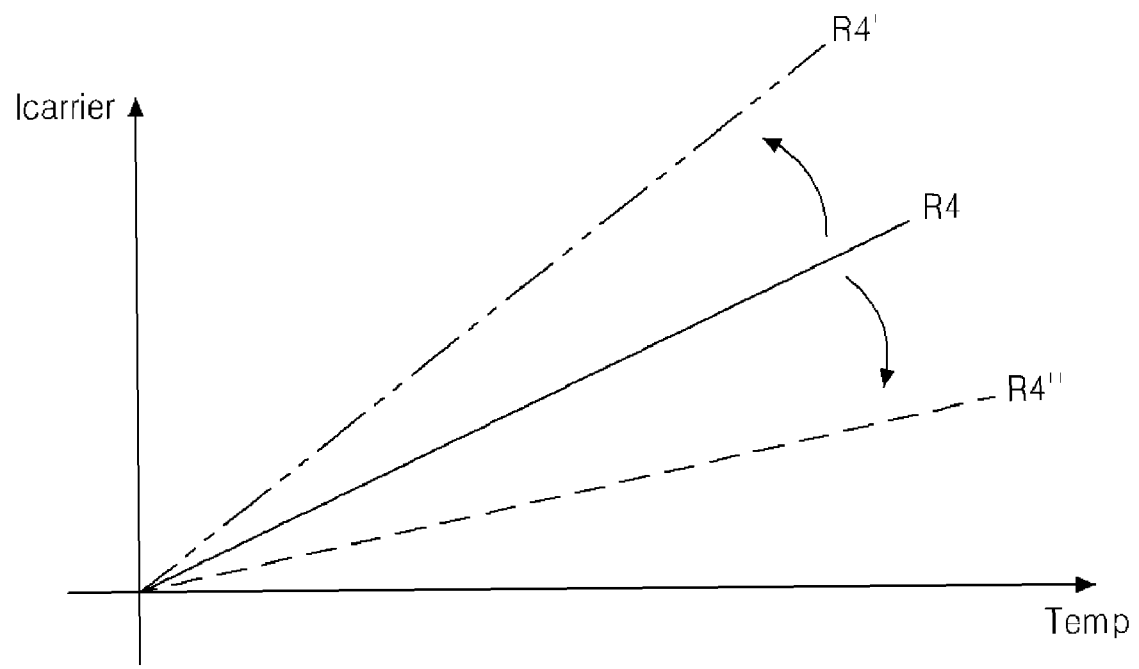
FIG. 4B is a graph for explaining a structure in which the proportional to absolute temperature (PTAT) slope of a carrier amplifier is adjusted according to some embodiments of the present invention.

The PTAT bias circuit 120 may include one or more resistors (e.g., R1, R2, R3, R4, and Rref), and the PTAT slope of the PTAT bias circuit 120 may be adjusted by changing at least one resistance of the resistors. For instance, the PTAT slope may be adjusted by changing the resistance of a resistor 121, which is shown in the graph illustrated in FIG. 4B. Referring to FIG. 4B, when the resistance of the resistor 121 is increased (to one of R4' and R4") or decreased (to the other of R4' and R4"), the bias current Icarrier is increased or decreased at the same temperature Temp. In other words, the bias can be adjusted to a value wanted by a circuit designer or manufacturer by changing the PTAT slope using the change in resistance in the PTAT bias circuit 120.

Figure 5A:
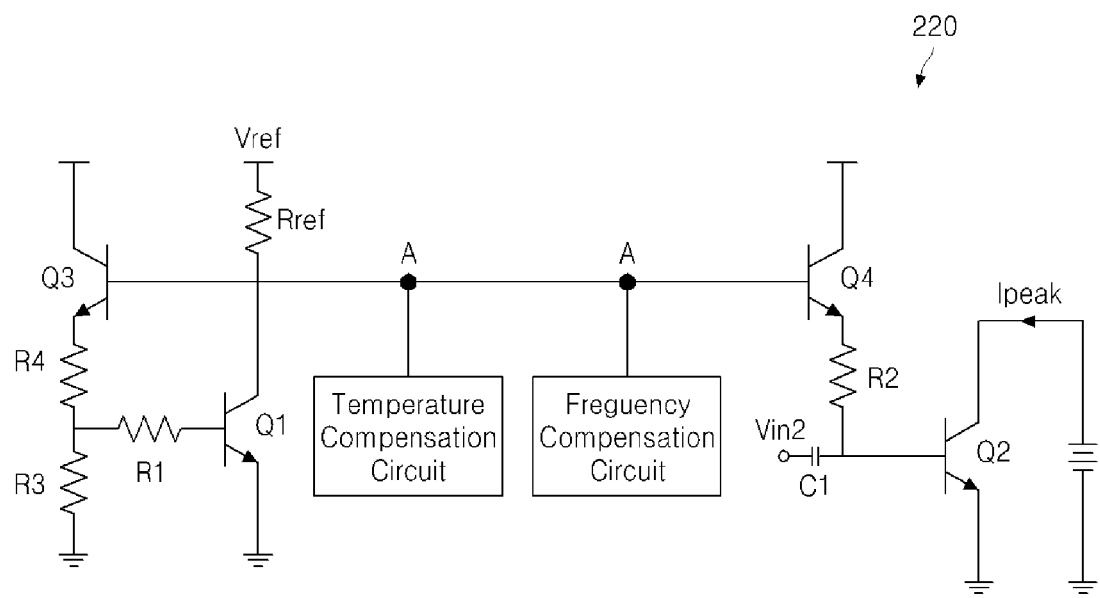
FIG. 5A is a circuit diagram of a peaking amplifier bias circuit according to some embodiments of the present invention.

FIG. 5A is a circuit diagram of the peaking amplifier bias circuit 220 for the peaking amplifier 210 according to some embodiments of the present invention. Referring to FIG. 5A, the peaking amplifier bias circuit 220 may include the PTAT bias circuit illustrated in FIG. 5A. Accordingly, the PTAT slope can be adjusted by adjusting the resistance R4. The peaking amplifier bias circuit 220 may also include at least one among a temperature compensation circuit 221 and a frequency compensation circuit 222.

Figure 5B:
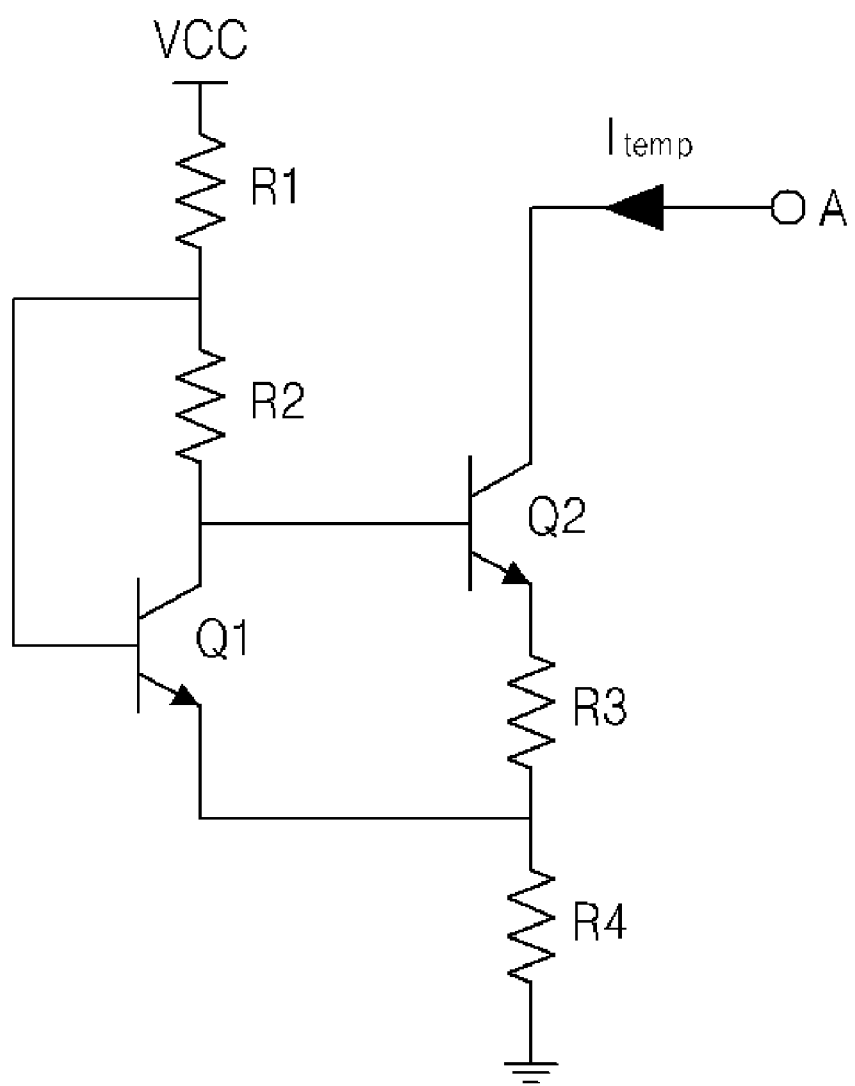
FIG. 5B is a circuit diagram of a temperature compensation circuit for a peaking amplifier according to some embodiments of the present invention.
Figure 5C:
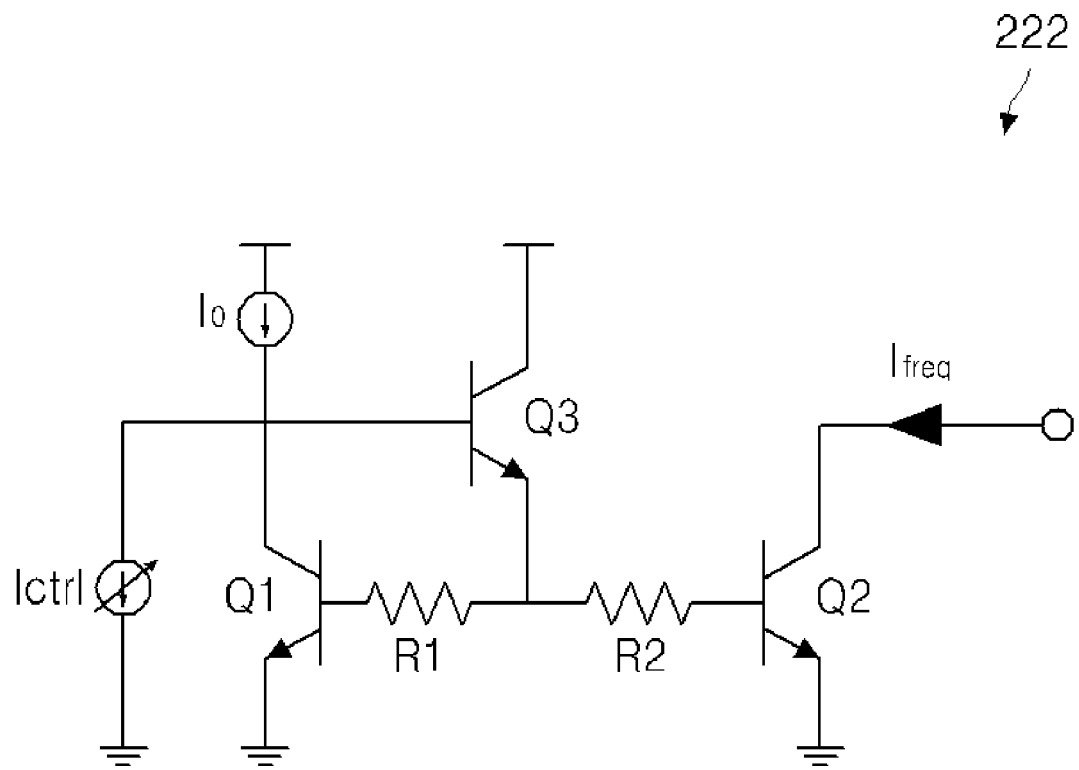
FIG. 5C is a circuit diagram of a frequency compensation circuit for a peaking amplifier according to some embodiments of the present invention.

FIG. 5B is a circuit diagram of the temperature compensation circuit 221 according to some embodiments of the present invention. The temperature compensation circuit 221 may be implemented by a PTAT circuit in which a current Itemp increases as temperature increases. FIG. 5C is a circuit diagram of the frequency compensation circuit 222 according to some embodiments of the present invention. The frequency compensation circuit 222 may be implemented by a proportional to absolute frequency (PTAF) circuit in which a current Ifreq increases as frequency increases. At this time, the current source Ictrl may be applied to the PTAF circuit in response to the control signal CS related with the operating frequency When the peaking amplifier bias circuit 220 for the peaking amplifier 210 includes both of the temperature compensation circuit 221 illustrated in FIG. 5B and the frequency compensation circuit 222 illustrated in FIG. 5C, the temperature compensation circuit 221 and the frequency compensation circuit 222 may be connected in parallel with each other. The peaking amplifier bias circuit 220 may include at least one among the temperature compensation circuit 221 and the frequency compensation circuit 222, thereby controlling current to correspond to a predetermined frequency and/or having a temperature compensation characteristic.

The Doherty amplifier 1 according to some embodiments of the present invention may be applied to any device that amplifies and transfers a signal to another device. For instance, the Doherty amplifier 1 may be embedded in a WiBro phone, a WiMax phone, a WiBro mobile personal computer (PC), an ultra-mobile PC (UMPC), a notebook, a portable media player (PMP), an MP3 player, a high speed downlink packet access (HSDPA), and a navigation system. The Doherty amplifier 1 may be inserted in a form of dongle into a PC card, an HSDPA, an MP3 player, a universal serial bus (USB) memory, a navigation system, and so on and may be inserted into a notebook in a form of personal computer memory card international association (PCMCIA) card.

Figure 6A:
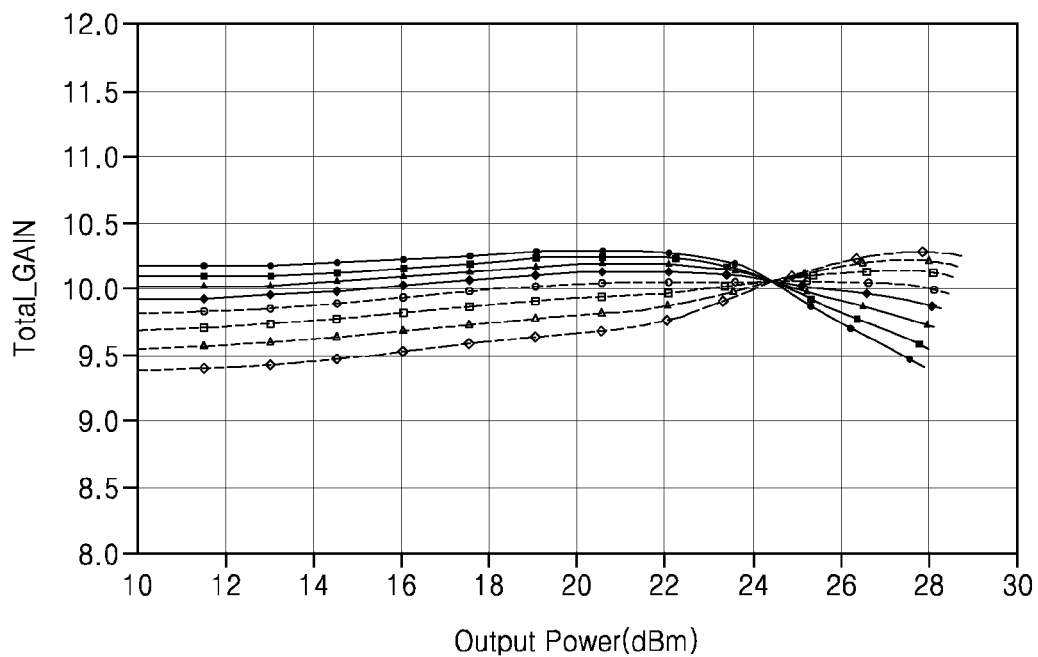
FIG. 6A illustrates gain and linearity with respect to frequency when a conventional method is used.
Figure 6A:
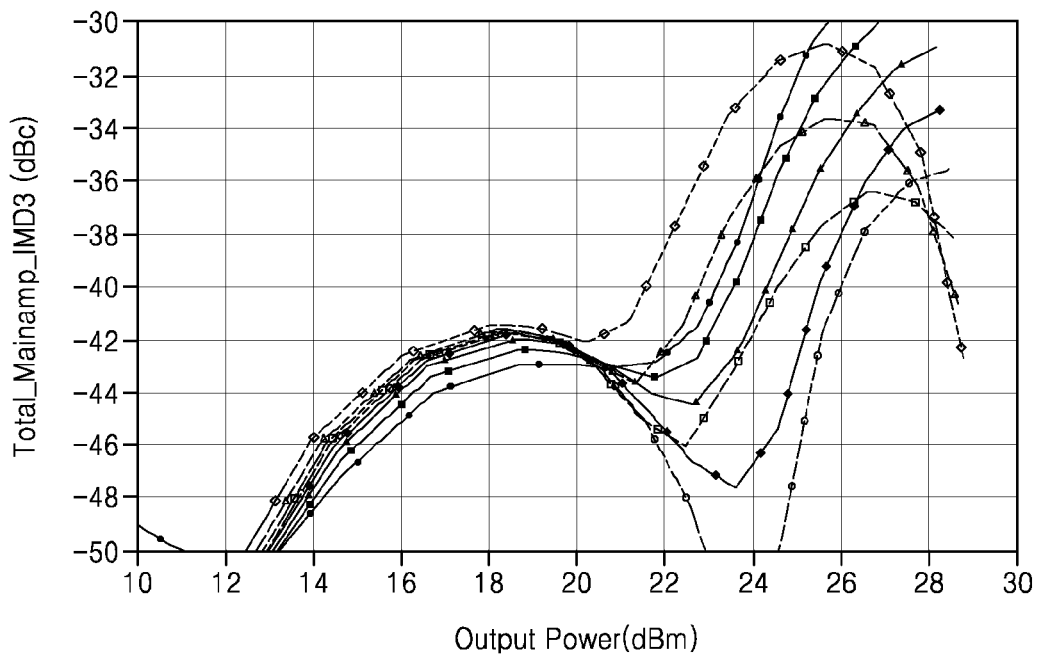
Figure 6B:
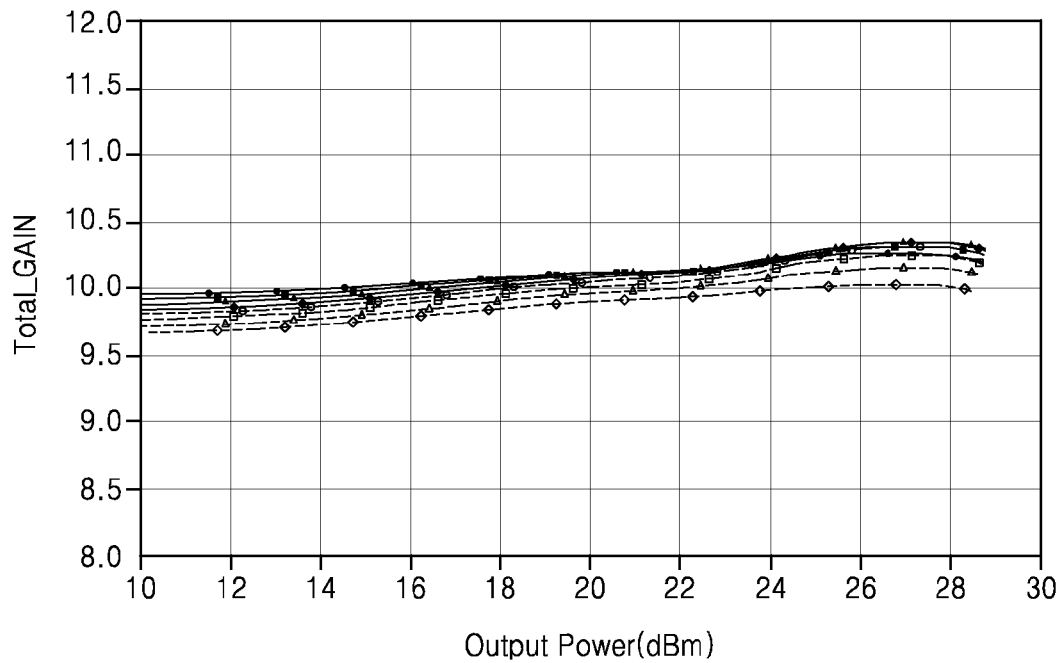
FIG. 6B illustrates improved gain and linearity when a Doherty amplifier according to some embodiments of the present invention is used.
Figure 6B:
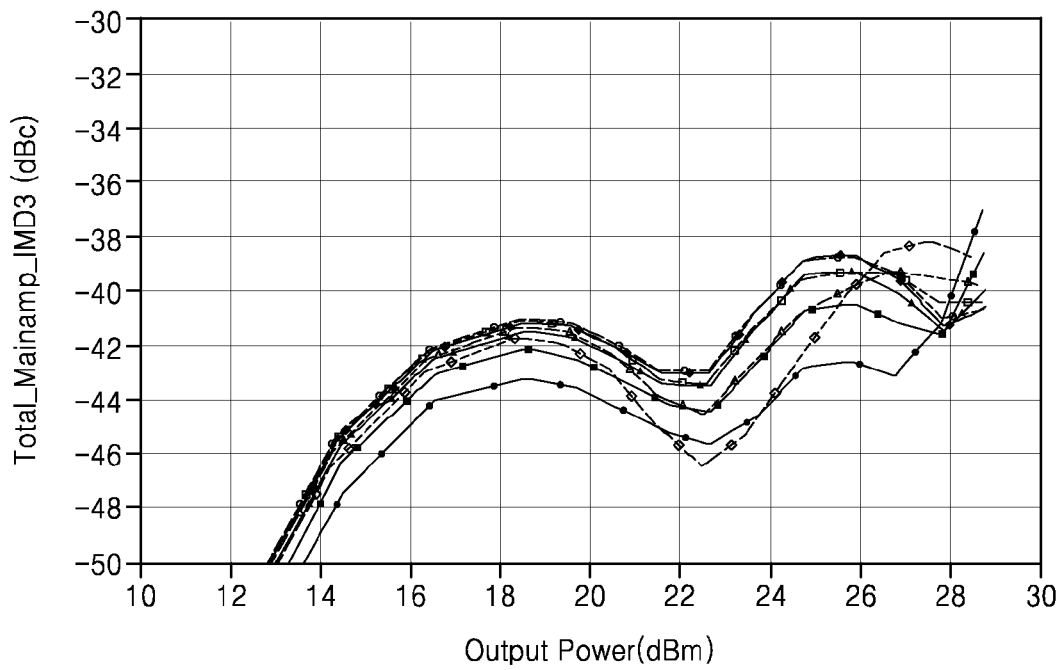

FIG. 6A illustrates gain and linearity with respect to frequency when a conventional method is used. FIG. 6B illustrates improved gain and linearity when a Doherty amplifier according to some embodiments of the present invention is used. Referring to FIG. 6A, the gain and the linearity were observed while frequency was changed by 30 MHz from 2.49 GHz to 2.7 GHz when a quarter wave transformer of a Doherty amplifier was fixed to 2.61 GHz. Good results are shown at a frequency of 2.61 GHz in terms of gain and linearity, but when a frequency is even just a little different from the fixed frequency, the gain changes a lot and the linearity rapidly deteriorates.

Referring to FIG. 6B, the gain and the linearity were observed when a Doherty amplifier changes at least one among capacitance and inductance using a control signal related with an operating frequency and adjusts an operating bias according to the frequency. The change in the gain is much improved and the linearity is uniform in an overall frequency range.

Figure 7A:
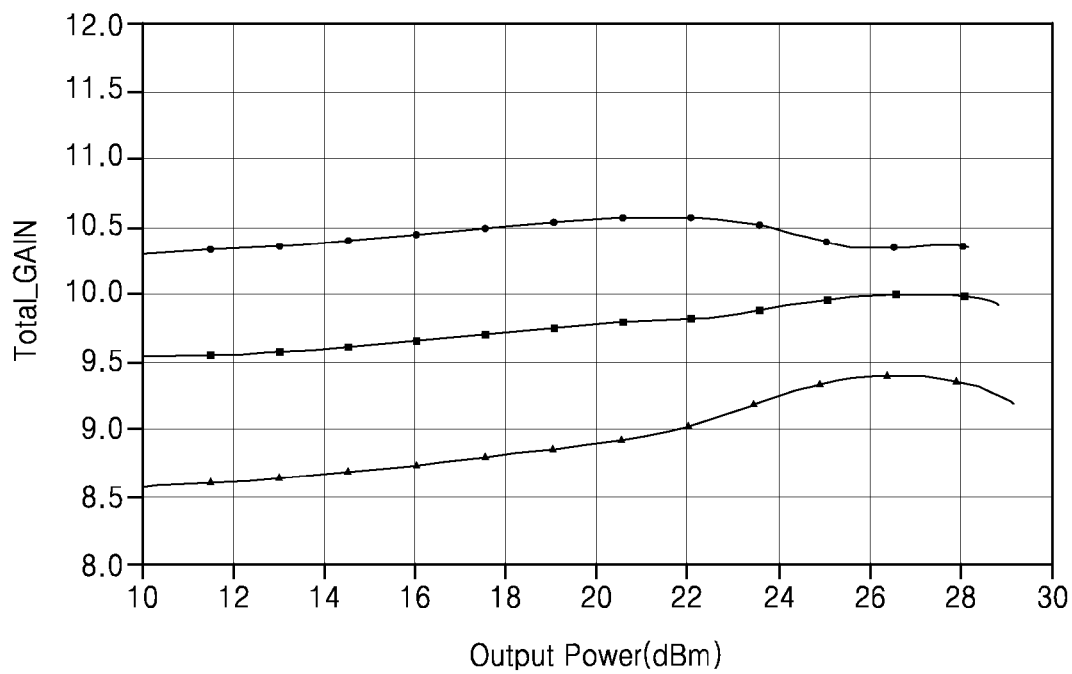
FIG. 7A illustrates linearity with respect to temperature when a conventional method is used.
Figure 7A:
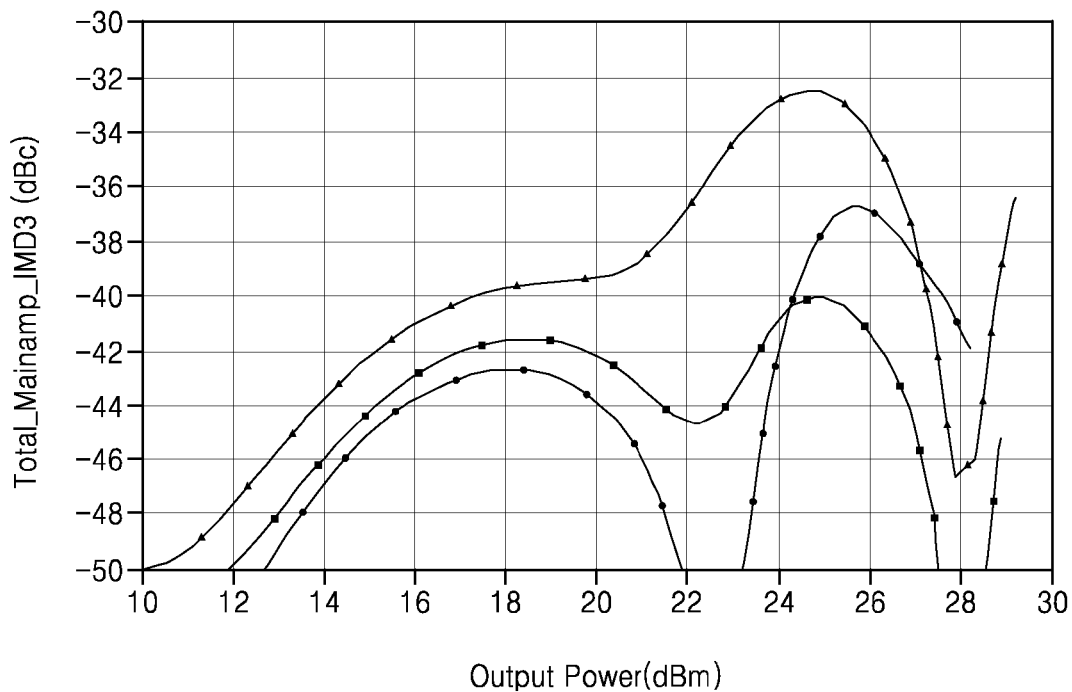
Figure 7B:
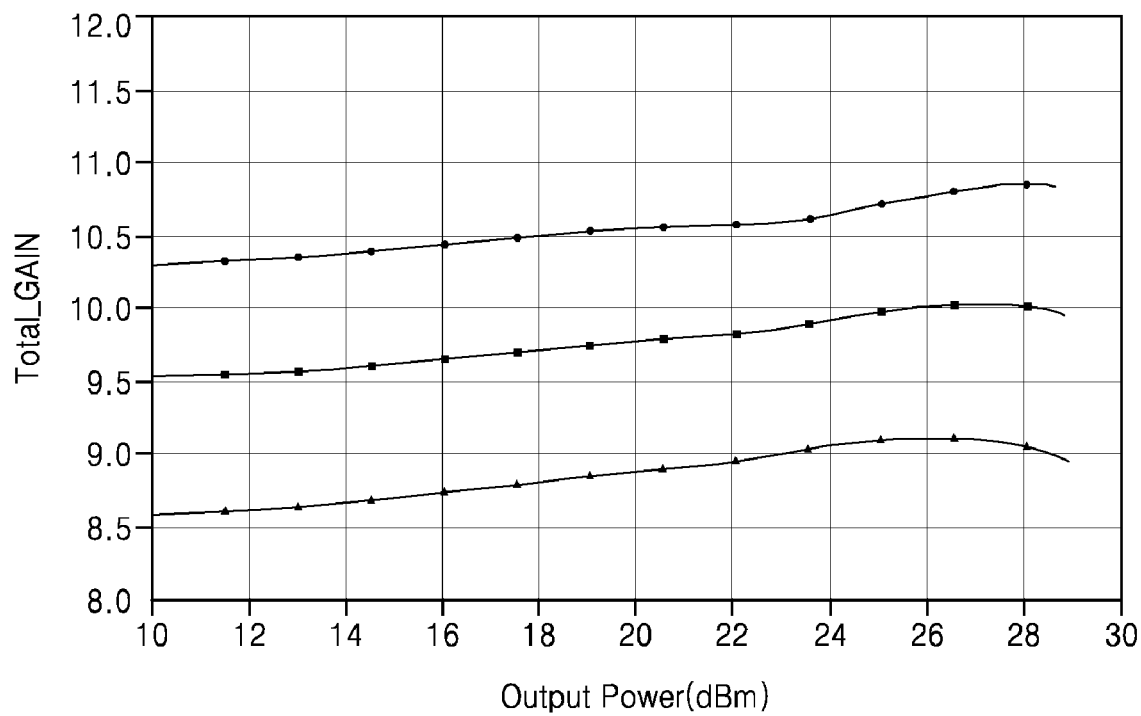
FIG. 7B illustrates improved linearity when a temperature compensation circuit according to some embodiments of the present invention is used.
Figure 7B:
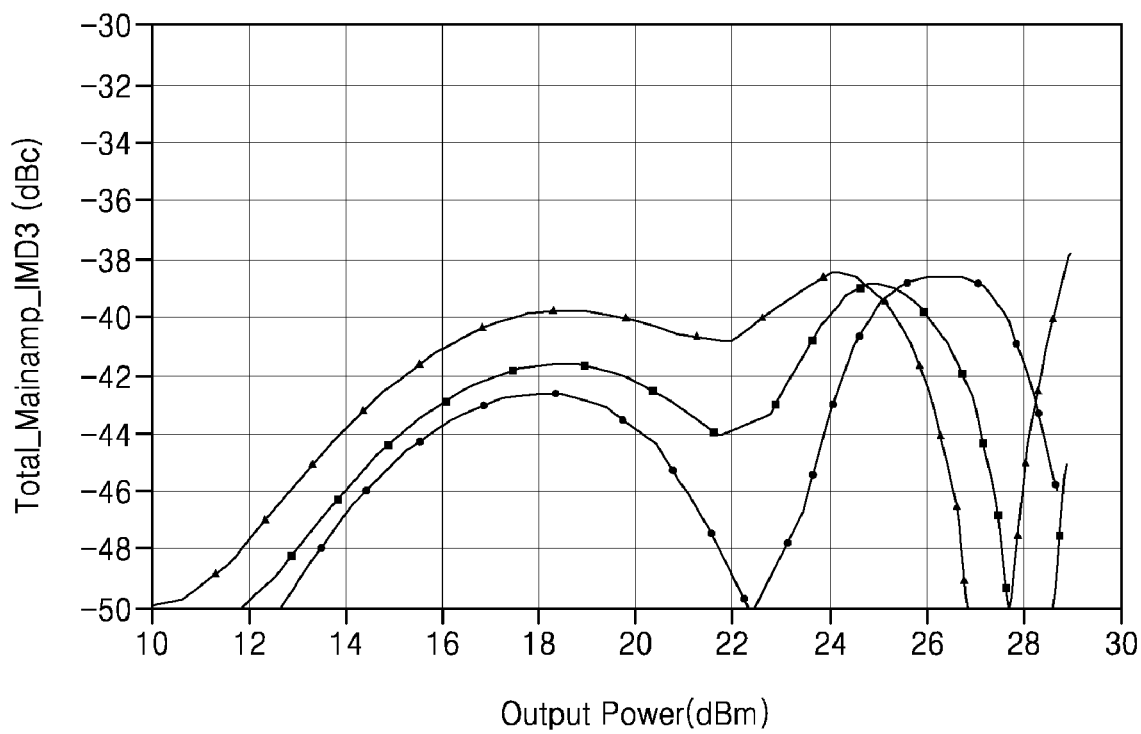

FIG. 7A illustrates linearity with respect to temperature when a conventional method is used. FIG. 7B illustrates improved linearity when a temperature compensation circuit according to some embodiments of the present invention is used. Referring to FIG. 7A, gain and linearity were observed when a Doherty amplifier adjusted a frequency to 2.61 GHz and temperature was changed from −35° C. to 25° C. and 85° C. without using the temperature compensation circuit. The gain has a big change and the linearity is not good when the temperature changes. Referring to FIG. 7B, when the temperature compensation circuit is used in a Doherty amplifier, the linearity is remarkably decreased as the temperature changes.

According to some embodiments of the present invention, a Doherty amplifier and a signal amplification system including the same efficiently amplify a signal in a broadband. In addition, they allow the size of the amplifier to be minimized by effectively removing an offset line. Furthermore, they improve sensitivity to a phase difference between two amplifiers, to the magnitude of a signal of each amplifier, and to frequency.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A Doherty amplifier comprising:
   a first path circuit comprising a carrier amplifier and a first impedance adjusting circuit connected with the carrier amplifier; and
   a second path circuit comprising a peaking amplifier, a second impedance adjusting circuit connected with the peaking amplifier, and a peaking amplifier bias circuit connected with the peaking amplifier,
   wherein at least one among an impedance of the first impedance adjusting circuit, an impedance of the second impedance adjusting circuit, and a bias of the peaking amplifier bias circuit is adjusted in response to a control signal, and
   wherein each of the first impedance adjusting circuit and the second impedance adjusting circuit comprises at least one capacitor and at least one inductor, and at least one among a capacitance of the at least one capacitor and an inductance of the at least one inductor is adjusted in response to the control signal.

2. The Doherty amplifier of claim 1, wherein the control signal is determined based on an operating frequency of the Doherty amplifier.

3. The Doherty amplifier of claim 1, wherein the second impedance adjusting circuit compensates for a phase difference corresponding to a difference between a bias of the carrier amplifier and a bias of the peaking amplifier.

4. A Doherty amplifier comprising:
   a first path circuit comprising a carrier amplifier and a first impedance adjusting circuit connected with the carrier amplifier; and
   a second path circuit comprising a peaking amplifier, a second impedance adjusting circuit connected with the peaking amplifier, and a peaking amplifier bias circuit connected with the peaking amplifier,
   wherein at least one among an impedance of the first impedance adjusting circuit, an impedance of the second impedance adjusting circuit, and a bias of the peaking amplifier bias circuit is adjusted in response to a control signal,
   wherein the first path circuit further comprises a carrier amplifier bias circuit configured to adjust a bias of the carrier amplifier, and a bias value of the peaking amplifier adjusted by the peaking amplifier bias circuit is less than a bias value of the carrier amplifier adjusted by the carrier amplifier bias circuit, and
   wherein at least one among the carrier amplifier bias circuit and the peaking amplifier bias circuit is implemented by a proportional to absolute temperature (PTAT) bias circuit.

5. The Doherty amplifier of claim 4, wherein the PTAT bias circuit comprises a plurality of resistors and adjusts a PTAT slope by changing a resistance of at least one of the resistors.

6. A Doherty amplifier comprising:
   a first path circuit comprising a carrier amplifier and a first impedance adjusting circuit connected with the carrier amplifier; and
   a second path circuit comprising a peaking amplifier, a second impedance adjusting circuit connected with the peaking amplifier, and a peaking amplifier bias circuit connected with the peaking amplifier,
   wherein at least one among an impedance of the first impedance adjusting circuit, an impedance of the second impedance adjusting circuit, and a bias of the peaking amplifier bias circuit is adjusted in response to a control signal, and
   wherein the first impedance adjusting circuit comprises a first variable capacitor circuit comprising a capacitor varying in response to the control signal to adjust the impedance of the first impedance adjusting circuit, and the second impedance adjusting circuit comprises a second variable capacitor circuit comprising a capacitor varying in response to the control signal to adjust the impedance of the second impedance adjusting circuit.

7. A Doherty amplifier comprising:
   a first path circuit comprising a carrier amplifier and a first impedance adjusting circuit connected with the carrier amplifier; and
   a second path circuit comprising a peaking amplifier, a second impedance adjusting circuit connected with the peaking amplifier, and a peaking amplifier bias circuit connected with the peaking amplifier,
   wherein at least one among an impedance of the first impedance adjusting circuit, an impedance of the second impedance adjusting circuit, and a bias of the peaking amplifier bias circuit is adjusted in response to a control signal, and
   wherein the peaking amplifier bias circuit comprises at least one among a temperature compensation circuit and a frequency compensation circuit, and a current of at least one among the temperature compensation circuit and the frequency compensation circuit is adjusted in response to the control signal.

8. A Doherty amplifier comprising:
   a splitter configured to split an input signal into a plurality of signals;
   a carrier amplifier configured to receive one signal among the plurality of signals output from the splitter and amplify the signal;
   a first phase adjusting circuit configured to shift a phase of a signal output from the carrier amplifier by 90°;
   a second phase adjusting circuit configured to shift by "90°+offset angle" a phase of another signal among the plurality of signals output from the splitter; and
   a peaking amplifier configured to receive a signal output from the second phase adjusting circuit and amplify the signal,
   wherein each of the first phase adjusting circuit and the second phase adjusting circuit comprises at least one capacitor and at least one inductor and adjusts at least one among a capacitance of the at least one capacitor and an inductance of the at least one inductor in response to a control signal.

9. The Doherty amplifier of claim 8, wherein the offset angle is determined based on a difference between a bias of the carrier amplifier and a bias of the peaking amplifier.

10. The Doherty amplifier of claim 8, wherein the control signal is determined based on an operating frequency of the Doherty amplifier.

11. A signal amplification system comprising:
    a control signal generator configured to modulate or demodulate a signal and output a control signal based on a frequency of the signal; and
    a Doherty amplifier,
    wherein at least one among impedance of the Doherty amplifier, a phase of the Doherty amplifier, and a bias of the Doherty amplifier is adjusted in response to the control signal output from the control signal generator,
    wherein the Doherty amplifier comprises:
    a first impedance adjusting circuit connected with a carrier amplifier;
    a second impedance adjusting circuit connected with a peaking amplifier; and a peaking amplifier bias circuit connected with the peaking amplifier, wherein at least one among an impedance of the first impedance adjusting circuit, an impedance of the second impedance adjusting circuit, and a bias of the peaking amplifier bias circuit is adjusted in response to the control signal, and wherein each of the first impedance adjusting circuit and the second impedance adjusting circuit comprises at least one capacitor and at least one inductor, and at least one among a capacitance of the at least one capacitor and an inductance of the at least one inductor is adjusted in response to the control signal.

12. A signal amplification method of a Doherty amplifier, the method comprising:

adjusting a phase of an amplified signal output from a carrier amplifier in response to a control signal generated as a result of detecting an operating frequency, using a first phase adjusting circuit;

adjusting a phase of an input signal input to an input terminal of a peaking amplifier to be the same as the phase of the amplified signal in response to the control signal, using a second phase adjusting circuit; and adjusting a magnitude of the input signal input to the input terminal of the peaking amplifier to be the same as a magnitude of the amplified signal in response to the control signal, using a peaking amplifier bias circuit.

13. The method of claim 12, wherein the first phase adjusting circuit adjusts at least one among a capacitance of the first phase adjusting circuit and an inductance of the first phase adjusting circuit in response to the control signal, thereby adjusting the phase of the amplified signal and outputting a phase-adjusted amplified signal, the second phase adjusting circuit adjusts at least one among a capacitance of the second phase adjusting circuit and an inductance of the second phase adjusting circuit in response to the control signal, thereby adjusting the phase of the input signal to be the same as a phase of the phase-adjusted amplified signal, and the peaking amplifier bias circuit adjusts a bias of the peaking amplifier bias circuit connected with the peaking amplifier in response to the control signal, thereby adjusting the magnitude of the input signal to be the same as a magnitude of a magnitude-adjusted amplified signal.

14. A signal amplification method of a Doherty amplifier, the method comprising:

detecting an operating frequency of the Doherty amplifier and outputting a control signal, using a control signal generator; and adjusting at least one among an impedance of a first impedance adjusting circuit connected with a carrier amplifier of the Doherty amplifier, an impedance of a second impedance adjusting circuit connected with a peaking amplifier of the Doherty amplifier, and a bias of a peaking amplifier bias circuit connected with the peaking amplifier in response to the control signal, using the Doherty amplifier, wherein the impedance of the first impedance adjusting circuit is adjusted by adjusting at least one among a capacitance of the first impedance adjusting circuit and an inductance of the first impedance adjusting circuit in response to the control signal, the impedance of the second impedance adjusting circuit is adjusted by adjusting at least one among a capacitance of the second impedance adjusting circuit and an inductance of the second impedance adjusting circuit in response to the control signal, and the bias of the peaking amplifier bias circuit is adjusted by adjusting a current of a temperature compensation circuit or frequency compensation circuit of the peaking amplifier bias circuit.

* * * * *